(12) United States Patent
Armstrong et al.

(10) Patent No.: US 12,084,761 B2
(45) Date of Patent: Sep. 10, 2024

(54) MULTI-DEPTH FILM FOR OPTICAL DEVICES

(71) Applicant: Applied Materials, Inc., Santa Clara, CA (US)

(72) Inventors: Karl J. Armstrong, Sunnyvale, CA (US); Ludovic Godet, Sunnyvale, CA (US); Brian Alexander Cohen, Delmar, NY (US); Wayne McMillan, San Jose, CA (US); James D. Strassner, Austin, TX (US); Benjamin B. Riordon, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/111,385

(22) Filed: Feb. 17, 2023

(65) Prior Publication Data

US 2023/0203647 A1    Jun. 29, 2023

Related U.S. Application Data

(62) Division of application No. 16/843,347, filed on Apr. 8, 2020, now Pat. No. 11,608,558.

(Continued)

(51) Int. Cl.
*H01L 21/677* (2006.01)
*C23C 14/04* (2006.01)
(Continued)

(52) U.S. Cl.
CPC .......... *C23C 16/405* (2013.01); *C23C 14/042* (2013.01); *C23C 14/0652* (2013.01);
(Continued)

(58) Field of Classification Search
CPC ..................................................... H01L 21/682
See application file for complete search history.

(56) References Cited

U.S. PATENT DOCUMENTS

| 4,776,868 A | 10/1988 | Trotter, Jr. et al. |
| 5,728,215 A | 3/1998 | Itagaki et al. |
| (Continued) | | |

FOREIGN PATENT DOCUMENTS

| CN | 107887509 A | 4/2018 |
| CN | 108026627 A | 5/2018 |
| (Continued) | | |

OTHER PUBLICATIONS

1 Chinese Office Action issued to Patent Application No. 202080026802.3 on Feb. 25, 2023.

(Continued)

*Primary Examiner* — Jonathan Snelting
(74) *Attorney, Agent, or Firm* — Patterson + Sheridan, LLP

(57) ABSTRACT

Embodiments of the present disclosure relate to forming multi-depth films for the fabrication of optical devices. One embodiment includes disposing a base layer of a device material on a surface of a substrate. One or more mandrels of the device material are disposed on the base layer. The disposing the one or more mandrels includes positioning a mask over of the base layer. The device material is deposited with the mask positioned over the base layer to form an optical device having the base layer with a base layer depth and the one or more mandrels having a first mandrel depth and a second mandrel depth.

7 Claims, 12 Drawing Sheets

Related U.S. Application Data

(60) Provisional application No. 62/832,752, filed on Apr. 11, 2019.

(51) Int. Cl.

| | |
|---|---|
| *C23C 14/06* | (2006.01) |
| *C23C 14/08* | (2006.01) |
| *C23C 14/14* | (2006.01) |
| *C23C 16/04* | (2006.01) |
| *C23C 16/24* | (2006.01) |
| *C23C 16/34* | (2006.01) |
| *C23C 16/40* | (2006.01) |
| *C23C 16/455* | (2006.01) |
| *C23C 16/56* | (2006.01) |
| *H01L 21/68* | (2006.01) |
| *H01L 21/683* | (2006.01) |
| *G02B 6/132* | (2006.01) |

(52) U.S. Cl.
CPC .......... *C23C 14/083* (2013.01); *C23C 14/086* (2013.01); *C23C 14/14* (2013.01); *C23C 16/042* (2013.01); *C23C 16/24* (2013.01); *C23C 16/345* (2013.01); *C23C 16/407* (2013.01); *C23C 16/45525* (2013.01); *C23C 16/56* (2013.01); *H01L 21/67766* (2013.01); *H01L 21/67778* (2013.01); *H01L 21/682* (2013.01); *H01L 21/6838* (2013.01); *G02B 6/132* (2013.01)

(56) References Cited

U.S. PATENT DOCUMENTS

| | | | |
|---|---|---|---|
| 6,343,171 B1 | 1/2002 | Yoshimura et al. | |
| 6,696,220 B2 | 2/2004 | Bailey et al. | |
| 7,142,363 B2 | 11/2006 | Sato et al. | |
| 8,873,144 B2 | 10/2014 | Davis | |
| 8,964,190 B2 | 2/2015 | Tanaka et al. | |
| 10,304,713 B2 | 5/2019 | White et al. | |
| 10,937,681 B2 * | 3/2021 | Amano | H01L 21/6838 |
| 11,608,558 B2 * | 3/2023 | Armstrong | C23C 14/042 |
| 2002/0168166 A1 | 11/2002 | Itoh et al. | |
| 2003/0159528 A1 | 8/2003 | Kim et al. | |
| 2004/0150311 A1 | 8/2004 | Jin | |
| 2008/0063851 A1 | 3/2008 | Jackman et al. | |
| 2010/0136784 A1 | 6/2010 | Mebarki et al. | |
| 2012/0190183 A1 | 7/2012 | Ricci | |
| 2015/0129544 A1 | 5/2015 | Davis | |
| 2015/0162231 A1 | 6/2015 | Cox et al. | |
| 2015/0325411 A1 | 11/2015 | Godet et al. | |
| 2016/0356958 A1 | 12/2016 | Shi et al. | |
| 2018/0142343 A1 | 5/2018 | Zeng et al. | |
| 2018/0209030 A1 | 7/2018 | Khayrullin et al. | |
| 2018/0341090 A1 | 11/2018 | Devlin et al. | |
| 2018/0348427 A1 | 12/2018 | Tervo | |
| 2019/0011708 A1 | 1/2019 | Schultz et al. | |
| 2019/0096733 A1 * | 3/2019 | Amano | H01L 21/68735 |

FOREIGN PATENT DOCUMENTS

| | | |
|---|---|---|
| EP | 0580112 A1 | 1/1994 |
| EP | 2264213 A1 | 12/2010 |
| JP | H200335883 A | 2/1991 |
| JP | 2002184804 A | 6/2002 |
| JP | 2016-106179 A | 6/2016 |
| KP | 20130046303 A | 5/2013 |
| TW | 201105809 A | 2/2011 |
| WO | 200481626 A1 | 9/2004 |

OTHER PUBLICATIONS

1 Taiwan Office Action issued Patent Application No. 109112135 on Nov. 17, 2023.
Japanese Office Action issued to Patent Application No. 2021-559554 on Feb. 7, 2023.
International Search Report and Written Opinion for International Application No. PCT/US2020/027205 dated Aug. 10, 2020.
Office Action for U.S. Appl. No. 16/843,347 dated Jan. 6, 2022.
Final Office Action for U.S. Appl. No. 16/843,347 dated Jun. 29, 2022.
Masters Thomas et al: "Easy Fabrication of Thin Membranes with Through Holes. Application to Protein Patterning", Plos One, vol. 7, No. 8, Aug. 31, 2012 (Aug. 31, 2012), p. e44261, XP093030314, DOI: 0.1371/journal.pone.0044261 Retrieved from the Internet: URL:https://journals.plos.org/plosone/arti cle/file?id=10.1371/journal.pone.0044261&t ype=printable> fugyre 4.
Siitonen Samuli et al: "A double-sided grating coupler for thin light guides", Optics Express, Mar. 5, 2007 (Mar. 5, 2007), pp. 2008-2018, XP093032228, Retrieved from the Internet: URL:https://opg.optica.org/directpdfaccess /25d907a2-e96b-453c-b9d1740abb5dffed_13055 8/oe-15-5-2008.pdf?da=l&id=130558 &seq=0&mobile=no [retrieved on Mar. 16, 2023] * figure 5 *.
European Search Report Issued to Patent Application No. 20787117.9 on Mar. 24, 2023.
China Office Action issued to Application No. 202080026802.3 on Sep. 13, 2023.
Korean Office Action issued to Patent Application No. 10-2021-7036619 on Jun. 19, 2023.

* cited by examiner

MULTI-DEPTH FILM FOR OPTICAL DEVICES

CROSS-REFERENCE TO RELATED APPLICATIONS

This application is a divisional of U.S. patent application Ser. No. 16/843,347, filed Apr. 8, 2020, which claims the benefit of U.S. Provisional Patent Application Ser. No. 62/832,752, filed Apr. 11, 2019, each of which is incorporated by reference herein in its entirety.

BACKGROUND

Field

Embodiments of the present disclosure generally relate to optical devices. More specifically, embodiments described herein provide for the formation of multi-depth films for the fabrication of optical devices.

Description of the Related Art

Optical devices may be used to manipulate the propagation of light by spatially varying structural parameters (e.g., shape, size, orientation) of structures of the optical devices formed on a substrate. The optical devices provide a spatially varying optical response that molds optical wavefronts as desired. These structures of the optical devices alter light propagation by inducing localized phase discontinuities (i.e., abrupt changes of phase over a distance smaller than the wavelength of the light). These structures may be composed of different types of materials, shapes, or configurations on the substrate and may operate based upon different physical principles.

Fabricating optical devices requires forming structures from a device material layer disposed on the substrate. However, the desired properties of an optical device to be fabricated may necessitate structures having various depths. Accordingly, what is needed in the art are methods for forming multi-depth films for the fabrication of optical devices.

SUMMARY

In one embodiment, a method is provided. The method includes disposing a base layer of a device material on a surface of a substrate. The base layer has a base layer depth. One or more mandrels of the device material are disposed on the base layer. The disposing the one or more mandrels includes positioning a mask over of the base layer. The mask has a first portion of a pattern of slots having a first masked depth and a second portion of the pattern of slots having a second masked depth. The first masked depth corresponds to mandrels having a first mandrel depth, and the second masked depth corresponds to mandrels having a second mandrel depth. The device material is deposited with the mask positioned over the base layer to form an optical device having the base layer with the base layer depth and the one or more mandrels having the first mandrel depth and the second mandrel depth.

In another embodiment, a method is provided. The method includes disposing a base layer of a device material on a surface of a substrate. The base layer has a base layer depth. One or more mandrels of the device material are disposed on the base layer. The disposing the one or more mandrels includes positioning a first mask over of the base layer and positioning a second mask over of the first mask. The first mask has a first pattern of slots having a first masked depth. The first masked depth corresponds to mandrels having a first mandrel depth. The second mask has a second pattern of slots having a second masked depth. The second masked depth corresponds to mandrels having a second mandrel depth. The device material is deposited with the first mask and second mask positioned over the base layer to form an optical device having the base layer with the base layer depth and the one or more mandrels having the first mandrel depth and the second mandrel depth.

In yet another embodiment, a method is provided. The method includes disposing a base layer of a device material on a surface of a substrate. The base layer has a base layer depth. A first patterned photoresist is disposed over the base layer. The first patterned photoresist has first openings and a first thickness corresponding to a first mandrel depth. The device material is deposited over the first patterned photoresist. The first patterned photoresist is removed to form one or more mandrels having the first mandrel depth. A second patterned photoresist is disposed over the base layer and the one or more mandrels having the first mandrel depth. The second patterned photoresist has second openings and a second thickness corresponding to a second mandrel depth. The device material is deposited over the second patterned photoresist. The second patterned photoresist is removed to form the one or more mandrels having the first mandrel depth and the second mandrel depth.

In another embodiment, a processing system comprises: a factory interface; a first actuator disposed within the factory interface; a second actuator disposed within the factory interface; an aligner station disposed within the factory interface; and a flipper device coupled to the factory interface.

In another embodiment, a method of assembling a carrier assembly comprises: inserting a carrier having a mask thereon into an alignment station; aligning the carrier and mask; separating the mask from the carrier; removing the carrier from the alignment station; inserting a substrate into the alignment station; contacting the substrate to the mask; and contacting the carrier to the substrate and mask to create a carrier assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
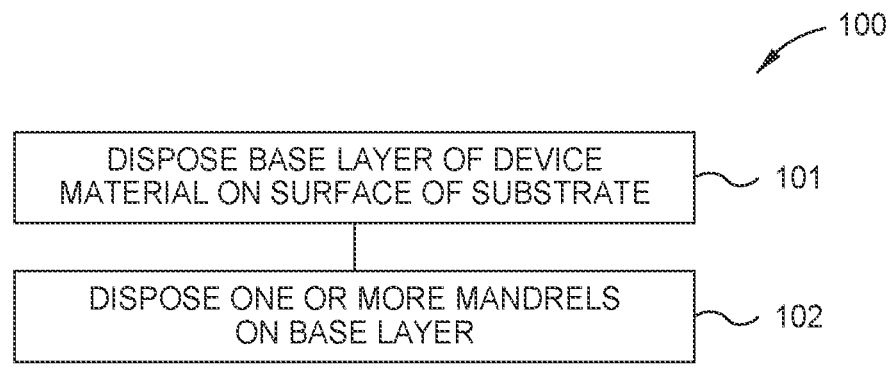
FIG. 1 is a flow diagram of a method for forming a multi-depth film according to an embodiment.
Figure 2A:
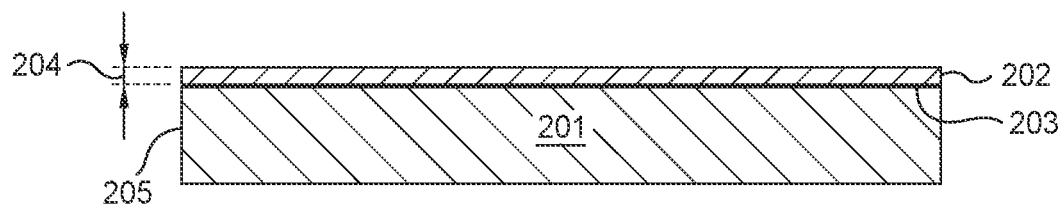
FIGS. 2A and 2B are schematic, cross-sectional views of a substrate during a method for forming a multi-depth film according to an embodiment.
Figure 2B:
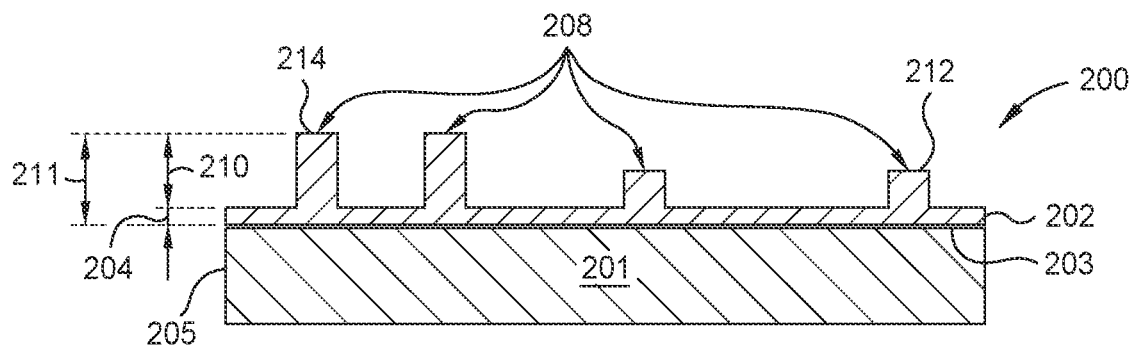

Embodiments of the present disclosure relate to forming multi-depth films for the fabrication of optical devices. FIG. 1 is a flow diagram of a method 100 for forming a multi-depth film 200. FIGS. 2A and 2B are schematic, cross-sectional views of a substrate 201 during the method 100 for forming the multi-depth film 200.

At operation 101, as shown in FIG. 2A, a base layer 202 of device material is disposed on a surface 203 of a substrate 201. The substrate 201 may also be selected to transmit a suitable amount of light of a desired wavelength or wavelength range, such as one or more wavelengths in the infrared region to UV region (i.e., from about 700 to about 1500 nanometers). Without limitation, in some embodiments, the substrate 201 is configured such that the substrate 201 transmits greater than or equal to about 50%, 50%, 70%, 80%, 90%, 95%, 99%, to UV region of the light spectrum. The substrate 201 may be formed from any suitable material, provided that the substrate 201 can adequately transmit light in a desired wavelength or wavelength range and can serve as an adequate support for the optical devices. In some embodiments, which can be combined with other embodiments described herein, the material of substrate 201 has a refractive index that is relatively low, as compared to the refractive index of the device material. Substrate selection may include substrates of any suitable material, including, but not limited to, amorphous dielectrics, crystalline dielectrics, silicon oxide, polymers, and combinations thereof. In some embodiments, which can be combined with other embodiments described herein, the substrate 201 includes a transparent material. In one embodiment, which can be combined with other embodiments described herein, the substrate 201 is transparent with absorption coefficient smaller than 0.001. Suitable examples may include an oxide, sulfide, phosphide, telluride or combinations thereof.

In one embodiment, which can be combined with other embodiments described herein, disposing the base layer 202 of device material over the surface 203 of the substrate 201 includes, but is not limited to, one or more of a liquid material pour casting process, a spin-on coating process, a liquid spray coating process, a dry powder coating process, a screen printing process, a doctor blading process, a physical vapor deposition (PVD) process, a chemical vapor deposition (CVD) process, a plasma-enhanced (PECVD) process, a flowable CVD (FCVD) process, and an atomic layer deposition (ALD) process. In another embodiment, which can be combined with other embodiments described herein, the material layer includes, but is not limited to, titanium dioxide ($TiO_2$), zinc oxide (ZnO), tin dioxide ($SnO_2$), aluminum-doped zinc oxide (AZO), fluorine-doped tin oxide (FTO), cadmium stannate (tin oxide) (CTO), and zinc stannate (tin oxide) ($SnZnO_3$), silicon nitride ($Si_3N_4$), and amorphous silicon (a-Si) containing materials. The base layer 202 has a base layer thickness 204 from the base layer 202 to the surface 203 of the substrate 201.

Figure 3A:
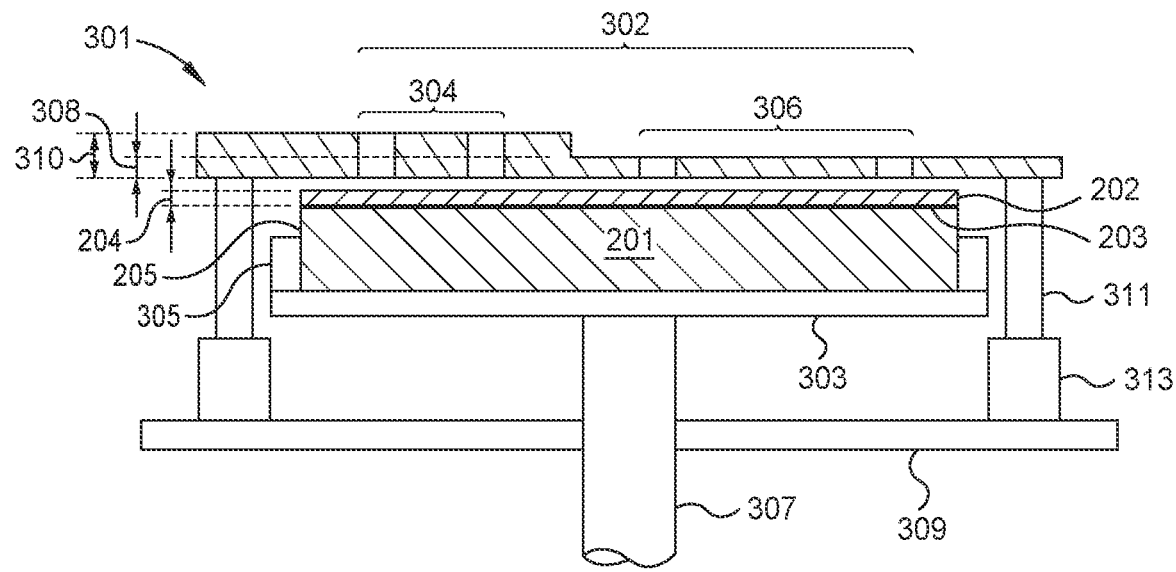
FIGS. 3A and 3B are schematic, cross-sectional views of a substrate positioned in a chamber during a method for forming a multi-depth film according to an embodiment.

At operation 102, as shown in FIG. 2B, one or more mandrels 208 of device material are disposed on the base layer 202 to form the multi-depth film 200. In one embodiment, which can be combined with other embodiments described herein, operation 102, as shown in FIG. 3A, includes positioning a mask 301, such as a shadow mask, over the substrate 201 and depositing the device material. Depositing the device material may include, but is not limited to, one or more of a PVD process, a CVD process, a PECVD process, a FCVD process, or an ALD process. The depositing the device material may be performed in a deposition chamber operable under vacuum pressure.

The mask 301 includes a pattern of slots 302 disposed through the mask 301. A first portion 304 of the pattern of slots 302 has a first masked depth 308 and a second portion 306 of the pattern of slots 302 has a second masked depth 310. The first portion 304 of the pattern of slots 302 having the first masked depth 308 forms one or more mandrels 208 having a first mandrel depth 210. The first mandrel depth 210 is a distance from a top surface 212 of the mandrels 208 having the first mandrel depth 210 to the base layer 202. The second portion 306 of the pattern of slots 302 having the second masked depth 310 forms one or more mandrels 208 having a second mandrel depth 211. The second mandrel depth 211 is a distance from a top surface 214 of the mandrels 208 having the second mandrel depth 211 to the base layer 202. As shown in FIG. 2B, the multi-depth film 200 includes the base layer 202 having the base layer thickness 204 and one or more mandrels 208 having the first mandrel depth 210 and the second mandrel depth 211. In one embodiment, which can be combined with other embodiments described herein, the multi-depth film 200 includes alignment marks (not shown) formed thereon for further processing, such as for patterning and/or etching the multi-depth film 200 to form structures of the device material on the substrate 201.

Figure 3B:
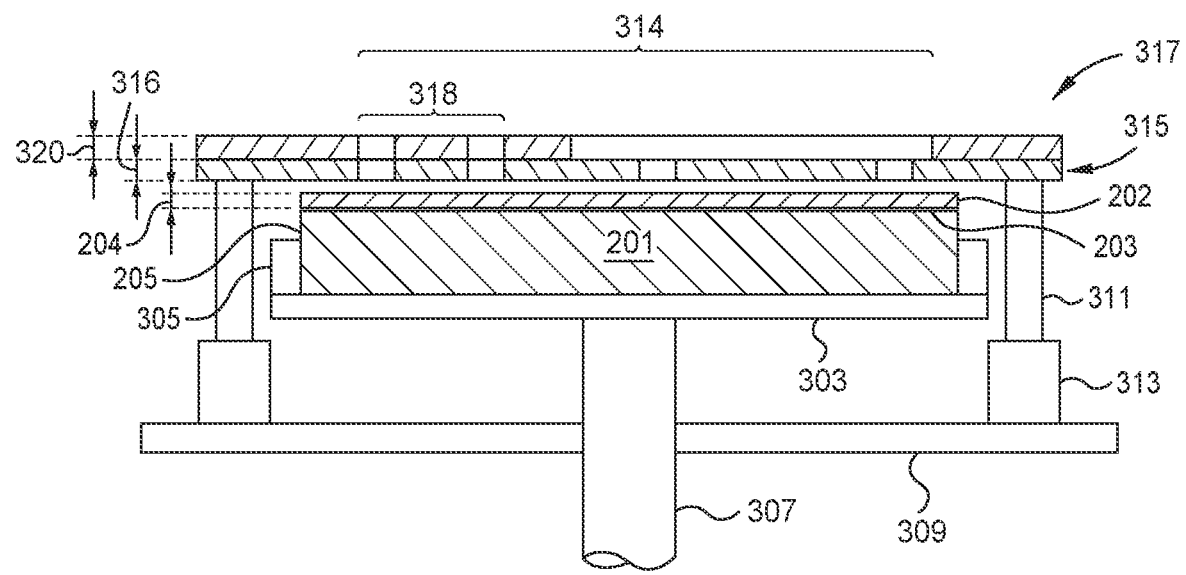

In one embodiment, which can be combined with other embodiments described herein, as shown in FIGS. 3A and 3B, the substrate 201 is retained on a substrate support 303. The substrate support 303 includes a clamp ring 305 capable of retaining the substrate 201 on the substrate support 303 without contacting the base layer 202 and the mandrels 208. In one embodiment, which can be combined with other embodiments described herein, the mask 301 assembled into the clamp ring 305 and exchanged at intervals based on a rate of accumulation of deposited device material changing the dimensions of the windows (e.g. slots 302) in the mask 301.

In another embodiment, which can be combined with other embodiments described herein, the mask 301 is formed from a substrate sized disk with an adhesive applied to the outer perimeter of the disk. This adhesive allows the substrate 201 to attach to the underside of the clamp ring 305. After the mask 301 has accumulated the maximum tolerable deposited device material, a heater in the chamber would be heated to a temperature which eliminates the adhesive force of the adhesive, releasing the substrate 201 to be retrieved and exchanged at load locks coupled to the chamber. In one embodiment, which can be combined with other embodiments described herein, the mask 301 may be loaded into a shutter disk area. A mechanism may attach the mask 301 to the clamp ring 305. A release mechanism may release the mask 301 attached to the underside of the clamp ring 305.

The substrate support 303 is coupled to a stem 307 which extends through the chamber body 309. The stem 307 is connected to a lift system (not shown) that moves the substrate support 303 between a processing position (as shown) and a transfer position (not shown) to facilitate transfer of the substrate 201. The mask 301 may include openings (not shown) to align the mask 301 with the substrate 201 and mask supports 311 coupled to one or more actuators 313 of a chamber body 309. The one or more actuators 313 control movement of the mask supports 311 to align the mask 301 (or the first mask 315 and the second mask 317 of FIG. 3B) with the substrate 201. The mask 301 may also prevent deposition of device material on edges 205 of the substrate 201 during operation 102.

In one embodiment, which can be combined with other embodiments described herein, the mask 301 is tape mask. The tape mask may include a polymer sheet, such as polyimide. The tape mask may be wound on a spool. At operation 102, the tape mask is feed through a feed mechanism that brings the tape in close contact with the substrate 201. A first mechanism is used to attach the tape mask to the substrate 201, such as static electric charge or an adhesive. A second mechanism, such as a roller or picture frame, is used to place the tape mask onto the substrate 201 in a controlled fashion. In one embodiment, which can be combined with other embodiments described herein, the tape mask is pre-patterned before being wound onto the roll. In another embodiment, which can be combined with other embodiments described herein, a laser scribing station is used to create any of a variety of mask patterns.

Figure 3C:
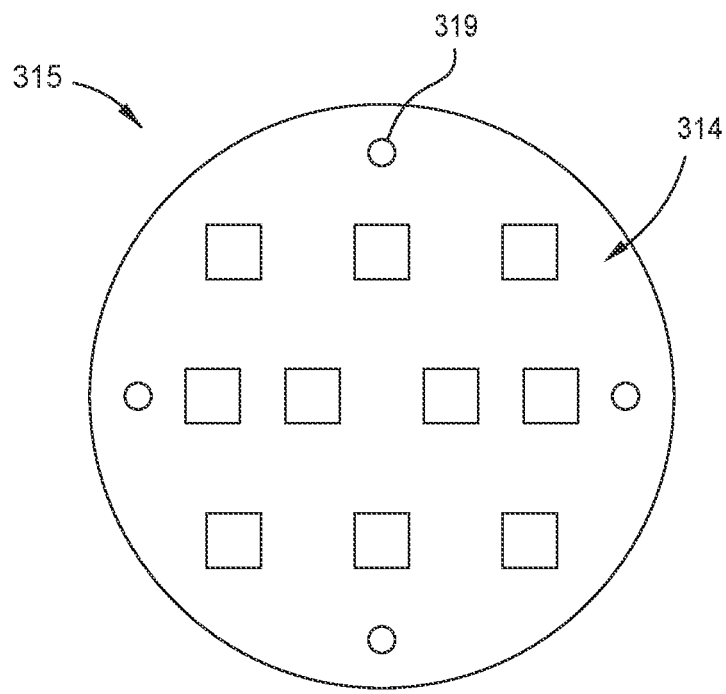
FIG. 3C is a schematic, top view of a first mask according to an embodiment.
Figure 3D:
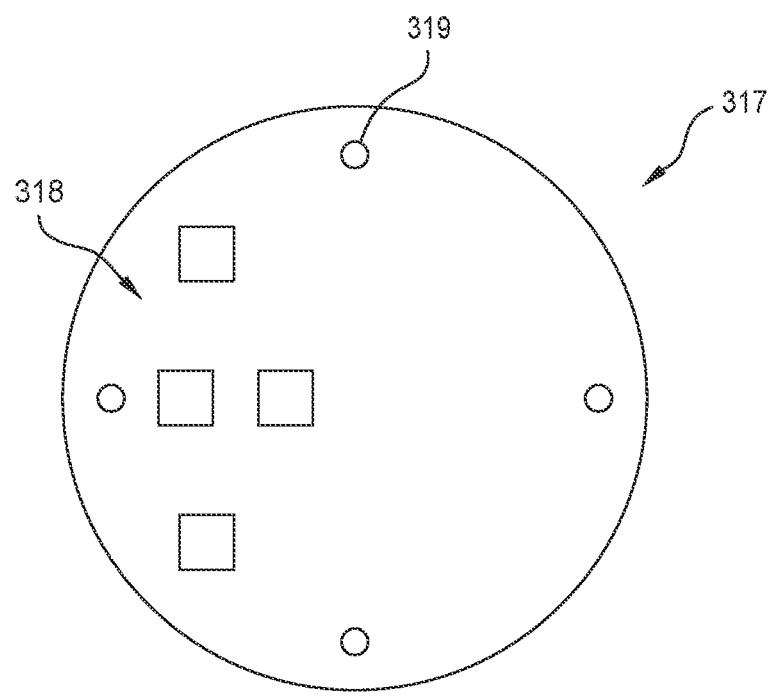
FIG. 3D is a schematic, top view of a second mask according to an embodiment.

In one embodiment, which can be combined with other embodiments described herein, operation 102, as shown in FIGS. 3B, 3C, and 3D, includes positioning a first mask 315 and a second mask 317 over the substrate 201 and depositing the device material. The depositing the device material may be performed with both the first mask 315 and the second mask 317 positioned over the substrate 201. The depositing the device material may be performed with the first mask 315 positioned over the substrate 201 and subsequently with the second mask 317 positioned over the substrate 201. Utilizing the first mask 315 and the second mask 317 forms the multi-depth film 200 including the base layer 202 having the base layer thickness 204 and one or more mandrels 208 having the first mandrel depth 210 and the second mandrel depth 211.

The first mask 315 includes a pattern of slots 314 disposed through the first mask 315. The pattern of slots 314 has a first masked depth 316. The pattern of slots 314 having the first masked depth 316 forms one or more mandrels 208 having the first mandrel depth 210. The second mask 317 includes a pattern of slots 318 disposed through the second mask 317. The pattern of slots 318 has a second masked depth 320. The pattern of slots 318 align with a portion of the pattern of slots 314. In one embodiment, which can be combined with other embodiments described herein, the pattern of slots 318 overlap with the portion of the pattern of slots 314. The pattern of slots 318 aligned with the portion of the pattern of slots 314 forms one or more mandrels 208 having the second mandrel depth 211. The first mask 315 and the second mask 317 may include openings 319 to align the first mask 315 and the second mask 317 with the substrate 201 and mask supports 311 coupled to one or more actuators 313 of the chamber body 309.

In one embodiment, which can be combined with other embodiments described herein, a gantry system is used to pick at least one substrate 201 from a conveyor belt and place each substrate 201 into a receiving area of a clamshell mask applicator. The clamshell mask applicator may be equipped with alignment capability and multiple masks (e.g., the first mask 315 and the second mask 317) may be aligned over the substrate 201. In one embodiment, which can be combined with other embodiments described herein, a bottom mask (e.g., the first mask 315) may have features patterned thereon and blank off patches may be affixed to the bottom mask. The blank off patches may be removed sequentially during the method 100.

Figure 4:
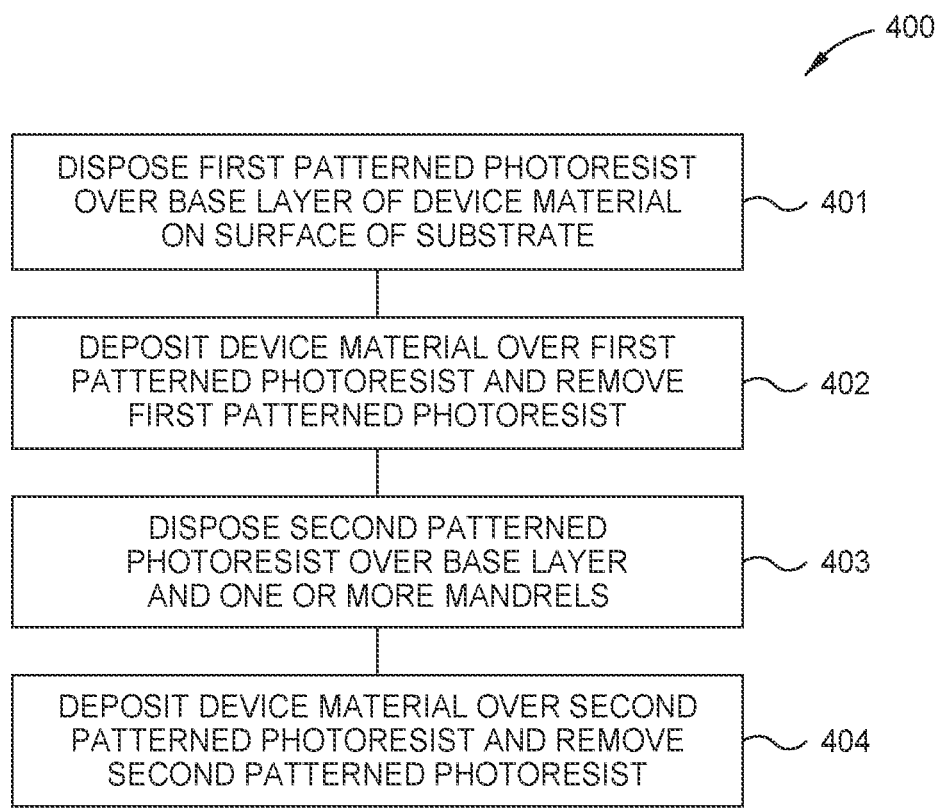
FIG. 4 is a flow diagram of a method for forming a multi-depth film according to an embodiment.
Figure 5A:
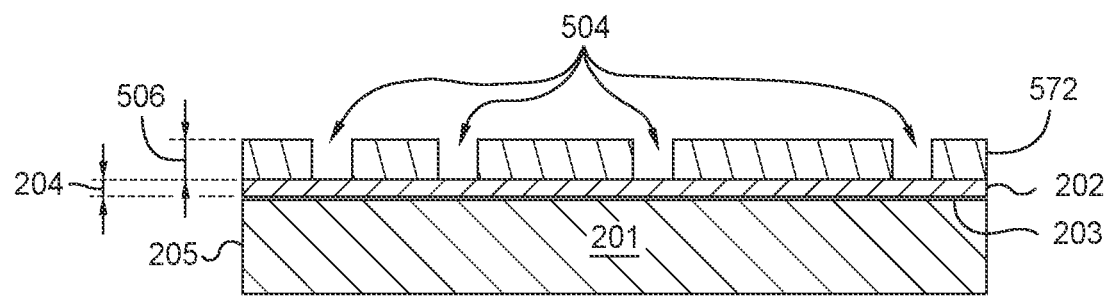
FIGS. 5A-5C are schematic, cross-sectional views of a substrate during a method for forming a multi-depth film according to an embodiment.
Figure 5B:
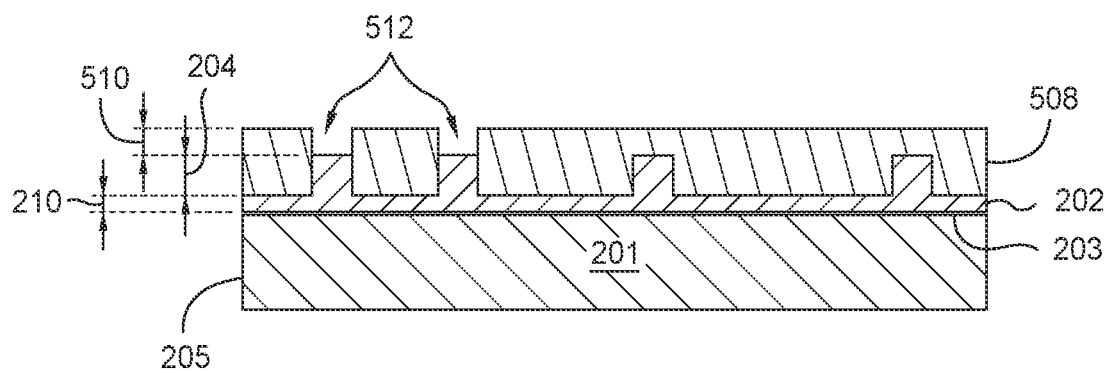
Figure 5C:
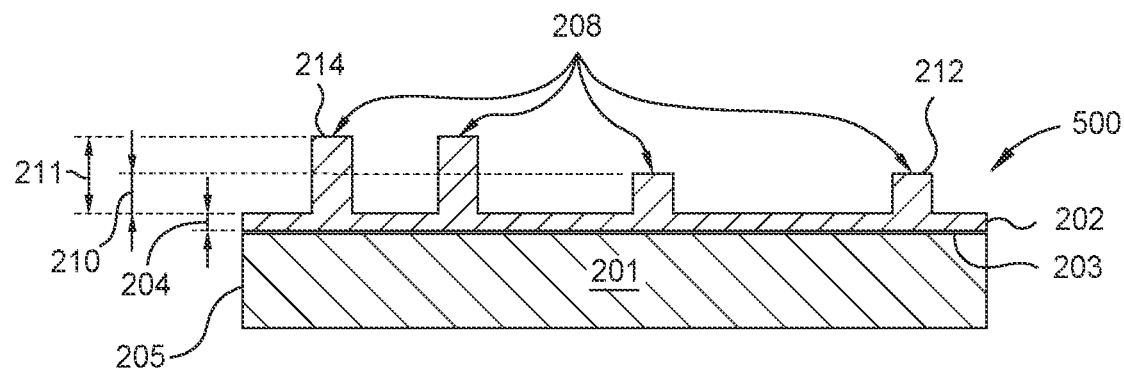

FIG. 4 is a flow diagram of a method 400 for forming a multi-depth film 500. FIGS. 5A-5C are schematic, cross-sectional views of a substrate 201 during the method 400 for forming the multi-depth film 500.

At operation 401, a first patterned photoresist 502 is disposed over the base layer 202 of the device material disposed on a surface 203 of a substrate 201. The base layer 202 of the device material is disposed on a surface 203 of a substrate 201 as described in operation 101 of the method 100. The first patterned photoresist 502 is formed by disposing a photoresist material over the base layer 202 and performing a lithography process. The first patterned photoresist 502 includes first openings 504 corresponding to one or more mandrels 208 to be formed having the first mandrel depth 210. The first patterned photoresist 502 has a first thickness 506 corresponding to the first mandrel depth 210.

At operation 402, the device material is deposited over the first patterned photoresist 502 and the first patterned photoresist 502 is removed to form one or more mandrels 208 having the first mandrel depth 210. Removing the first patterned photoresist 502 may include a lithography process or etching process. At operation 403, a second patterned photoresist 508 is disposed over the base layer 202 and the one or more mandrels 208 having the first mandrel depth 210. The second patterned photoresist 508 is formed by disposing a photoresist material over the base layer 202 and performing a lithography process. The second patterned photoresist 508 includes second openings 512 aligning with a portion of the one or more mandrels 208 having the first mandrel depth 210. The aligning second openings 512 with the portion of the one or more mandrels 208 having the first mandrel depth 210 will form one or more mandrels 208 having the second mandrel depth 211 after operation 403. The second patterned photoresist 508 has a second thickness 510 that combined with the first mandrel depth 210 corresponds to the second mandrel depth 211.

At operation 404, the device material is deposited over the second patterned photoresist 508 and the second patterned photoresist 508 is removed to form one or more mandrels 208 having the second mandrel depth 211. Removing the second patterned photoresist 508 may include a lithography process or etching process. Removing the second patterned photoresist 508 forms the multi-depth film 500 that includes the base layer 202 having the base layer thickness 204 and the one or more mandrels 208 having the first mandrel depth 210 and the second mandrel depth 211.

Figure 6:
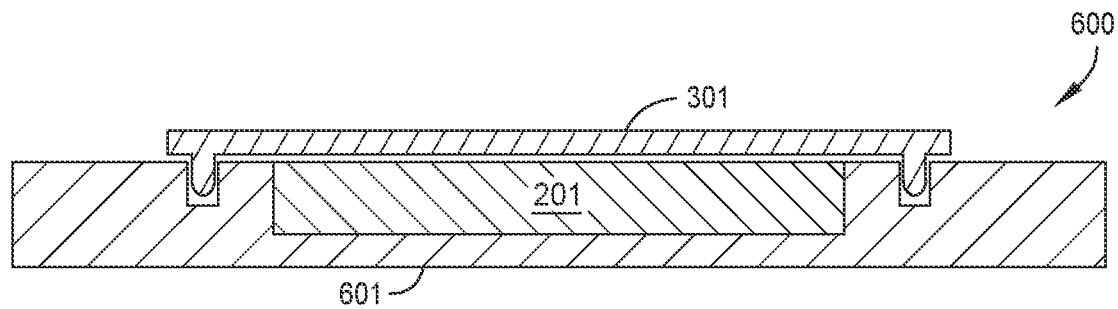
FIG. 6 is a cross-sectional view of a carrier assembly according to one embodiment.

FIG. 6 is a schematic view of carrier assembly 600 according to one embodiment. The carrier assembly 600 consists of carrier 601, the substrate 201, and the clamp ring or mask 301. The carrier assembly 600 is used for supporting and transporting the substrate 201 during processing. The carrier 601 supports the substrate 201 on the outer edges of the substrate as to not damage the backside of the substrate 201. In one embodiment, the carrier 601 is a 300 mm carrier. In one embodiment, the substrate 201 is a 200 mm substrate and the mask 301 is a 200 mm mask. In another embodiment, the substrate 201 is a 300 mm substrate and the mask is a 300 mm mask.

Figure 7A:
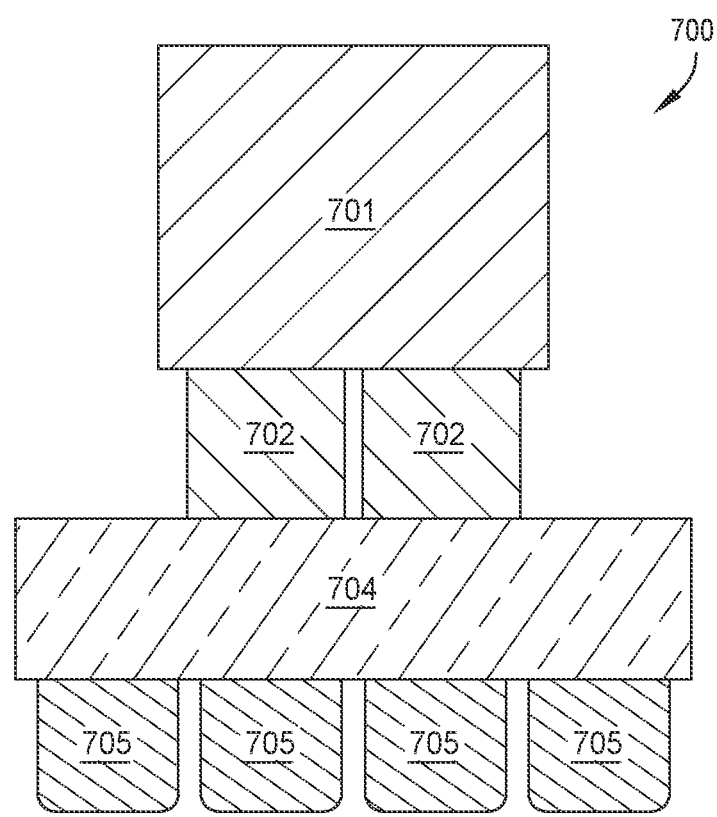
FIGS. 7A and 7B are a schematic, top view of a processing system and offline build tool according to one embodiment.

FIG. 7A is a schematic view of a processing system 700. The processing system 700 includes a transfer chamber 701 coupled to a load lock 702. It is to be understood that while two load locks 702 are shown in FIG. 7A, it is contemplated that a single load lock 702 may be used or even more than two load locks 702 may be used. Thus, the embodiments discussed herein are not to be limited to two load locks 702. Load locks 702 are coupled to factory interface 704. Load port stations 705 are coupled to factory interface 704. In one embodiment, as pictured in FIG. 7A, four load port stations 705 are present. It is to be understood that while four load port stations 705 are shown in FIG. 7A, it is contemplated that any number of load port stations 705 may be used. Thus, the embodiments discussed herein are not to be limited to four load port stations 705. In one embodiment, the process system 700 may be an etch process chamber. In another embodiment, the process system 700 may be a PVD process chamber. The load port stations 705 will contain one or more carrier assemblies 600. The carrier assemblies will be assembled at a location separate from the load port stations 705 and the factory interface 704.

The carrier assemblies 600 will be assembled in an offline build station 703. Build station 703 is used to build and unbuild one or more carrier assemblies 600 in an automated form. Building a carrier assembly 600 automatically is more efficient, both timely and costly, and prevents potential particle damage or breakage. Building a carrier assembly 600 automatically also produces a higher quality product than if the carrier assembly 600 were to be built manually.

Figure 7B:
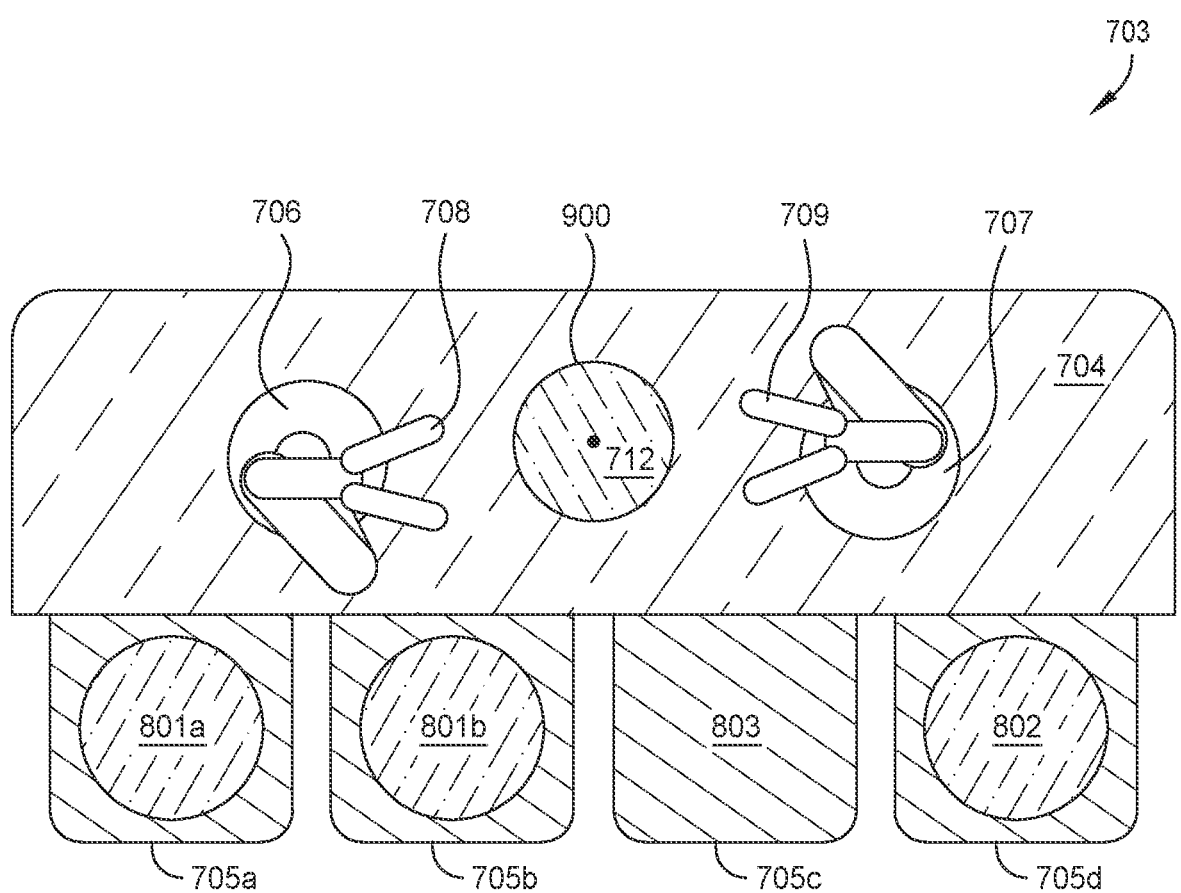

FIG. 7B is a detailed schematic view of the offline build station 703. The build station 703 is utilized to assemble the carrier assembly 600. The offline build station 703 has factory interface 704 and load port stations 705a-705d. Front opening unified pods (FOUPs) 801a and 801b are located at load port stations 705a and 705b, respectively. FOUP 802 is located at load port station 705d. Flipper device 803 is located at load port station 705c. Two actuators 706 and 707 are disposed within the factory interface 704. In one embodiment, the actuator 706 is Applied Materials 300 mm SCARA Robot and actuator 707 is Applied Materials 200 mm SCARA Robot. Actuators 706 and 707 are independent of one another. The actuators 706, 707 have actuator arms 708 and 709. The arms 708, 709 enable the actuators 706, 707 to receive and transport the components of carrier assembly 600. Vacuum chuck 710 and aligner 711 are positioned at aligner station 900 between actuators 706, 707 in the factory interface 704.

Figure 8A:
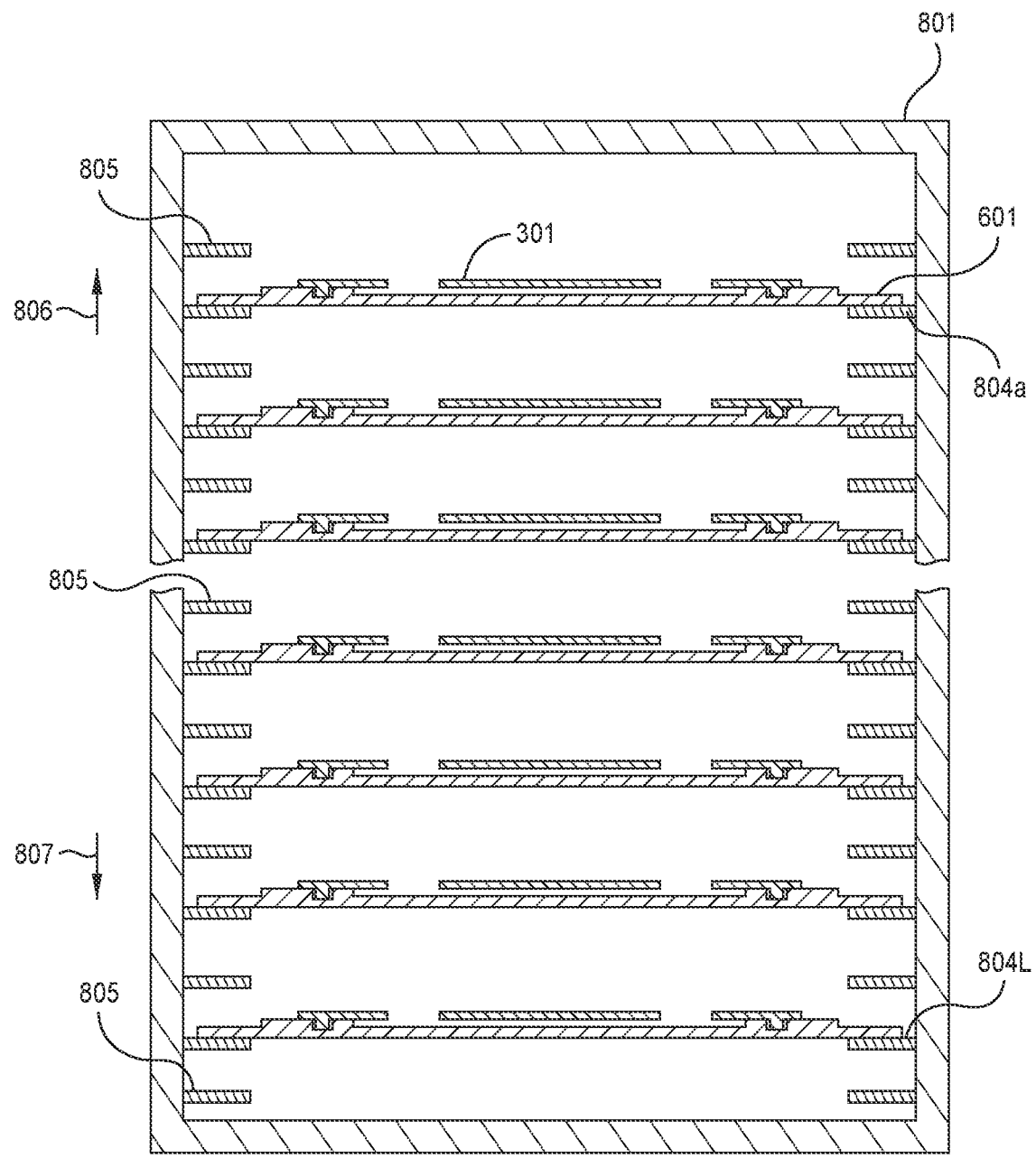
FIGS. 8A and 8B are a schematic, cross-sectional view of loaded front opening unified pods according to one embodiment.
Figure 8B:
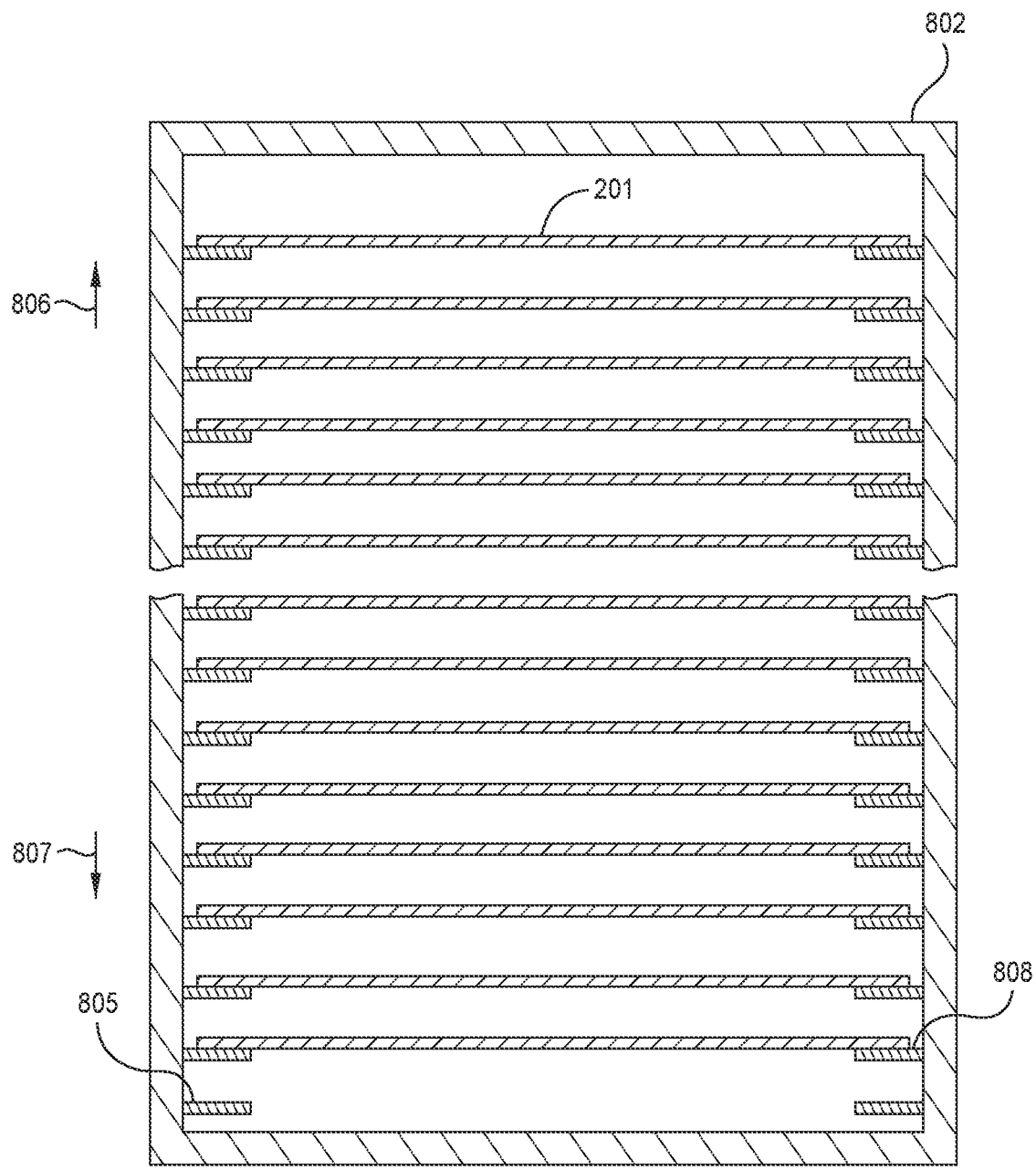

FIGS. 8A and 8B are cross-sectional views of FOUPs 801 and 802. FIG. 8A represents FOUP 801. FOUP 801 is loaded with carriers 601 and masks 301. FOUP 801 is a 300 mm FOUP. A generic FOUP is a cassette with twenty-five slots. FOUP 801 is skip-loaded utilizing every other slot of the twenty-five slots. Slots 804a-l represent loaded slots of FOUP 801. Slots 805 represent empty slots. Each FOUP 801 is loaded with twelve carrier assemblies 600. FIG. 8B represents FOUP 802. FOUP 802 is loaded with substrates 201. In one embodiment, FOUP 802 is a 300 mm FOUP. In another embodiment, FOUP 802 is a 200 mm substrate FOUP. FOUP 802 is loaded with twenty-four substrates 201.

Aligner 711 is utilized to orient mask 301, substrate 201, and carrier 601 in the XY direction. Aligner 711 is capable of rotating 360 degrees. The aligner 711 rotates the mask 301, substrate 201, or carrier 601 to find the center 712 of the mask 301, substrate 201, and carrier 601. The aligner 711 is able to locate the center 712 of the mask 301, substrate 201, or carrier 601 with accuracy of about 0.001 in. The aligner 711 is capable of aligning either 200 mm substrates or 300 mm substrates. In one embodiment, the mask 301, substrate 201, and carrier 601 are aligned by openings 319, as depicted in FIGS. 3C and 3D. As discussed below, the aligner 711 includes a vacuum chuck 710. The vacuum chuck 710 has inner region 901 and outer region 902. Inner region 901 is configured to chuck substrate 201. Outer region 902 is configured to chuck mask 301.

Figure 9A:
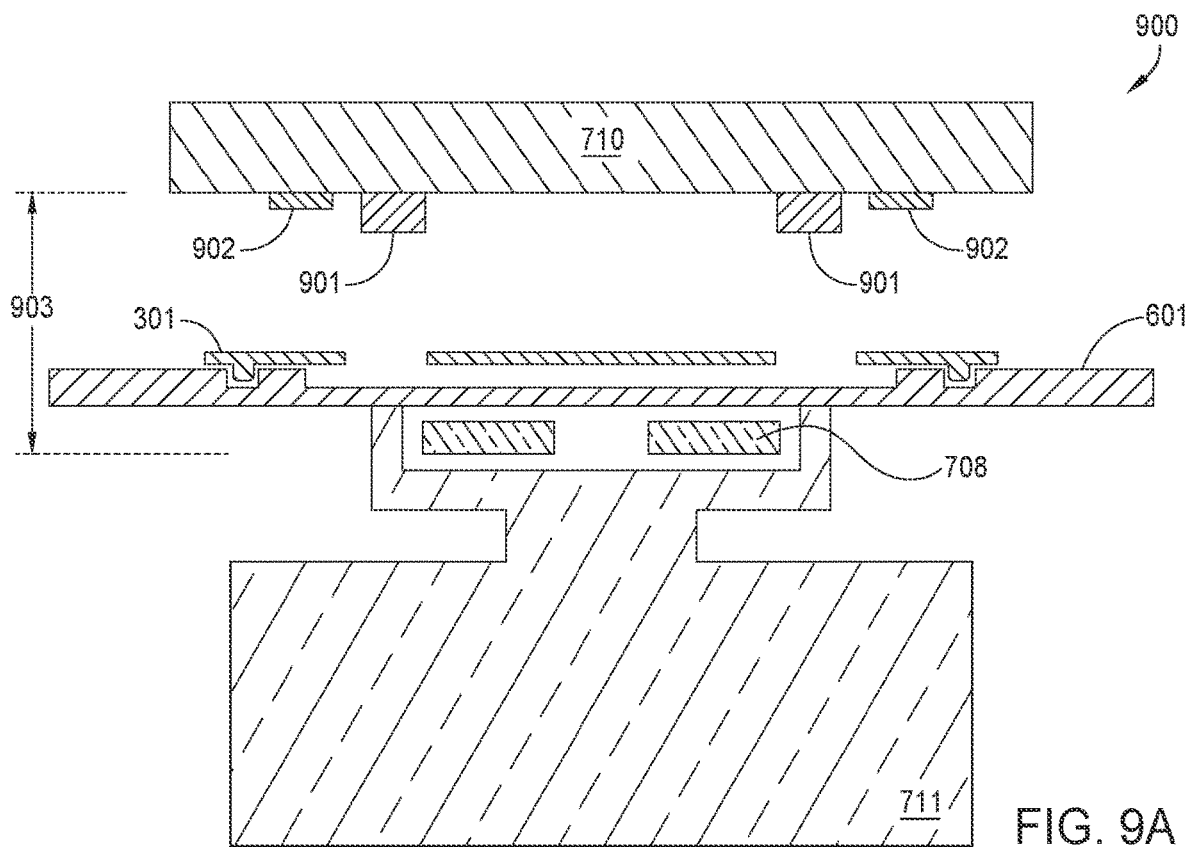
FIGS. 9A-9F are schematic, cross-sectional views of the build tool in FIG. 7B at various stages of operation.
Figure 9B:
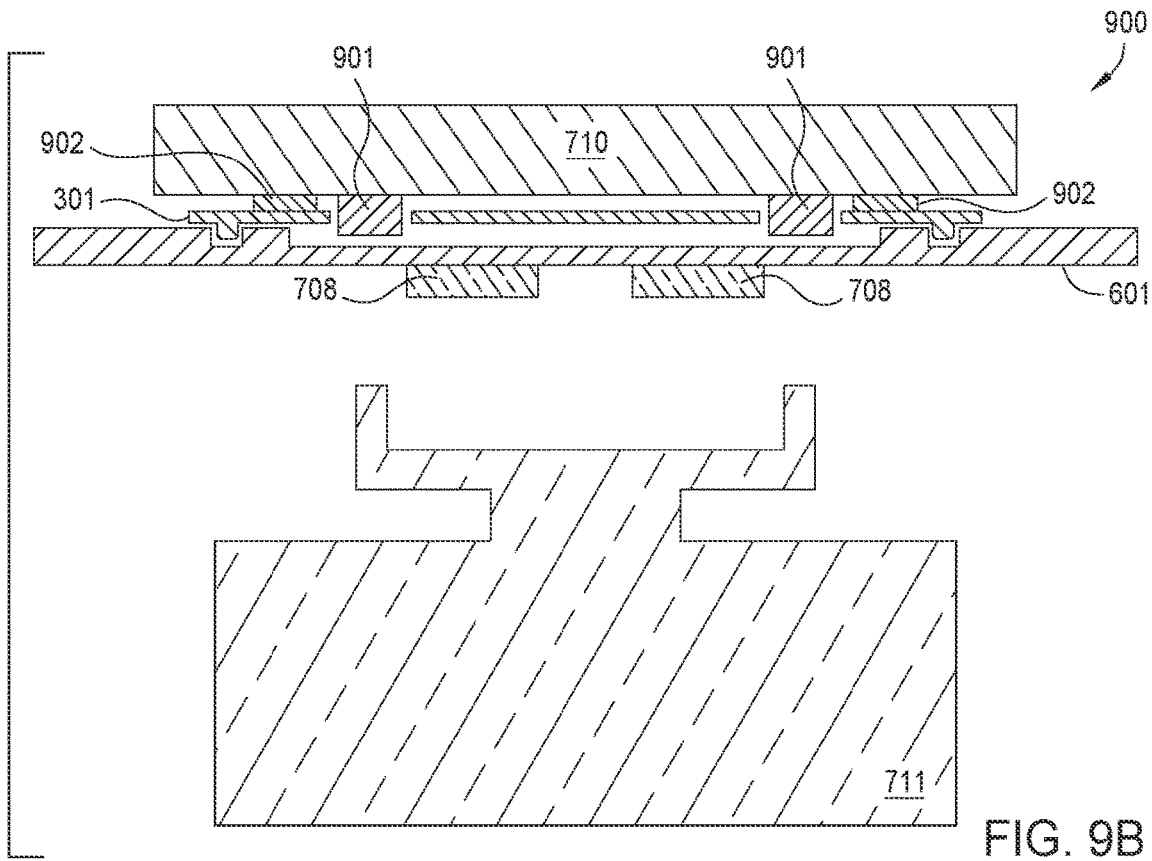
Figure 9C:
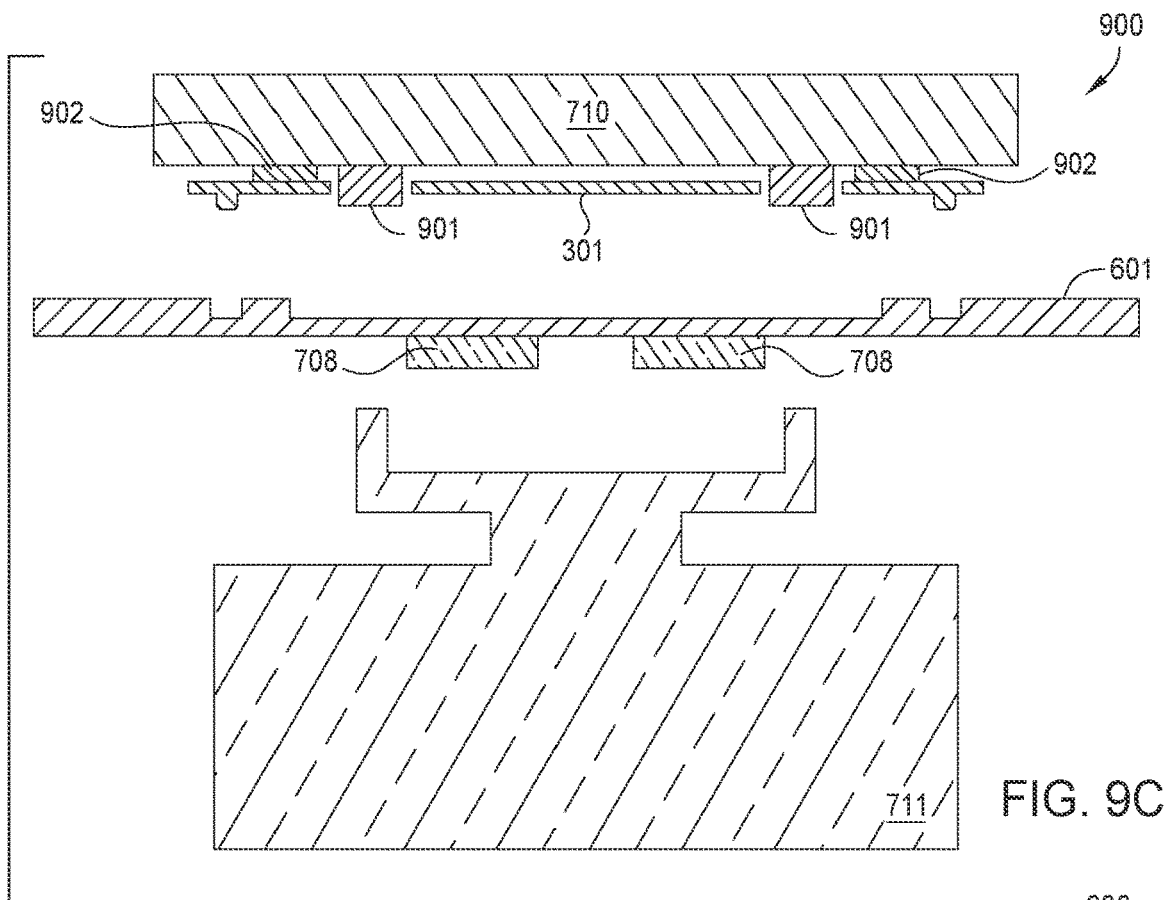

FIGS. 9A-9F are schematic, cross-sectional views of various stages of an exemplary embodiment of build station 703 building carrier assembly 600. FIG. 9A depicts the process beginning. The process begins by actuator 706 extending actuator arms 708 into FOUP 801a. It receives a mask 301 and carrier 601 by extending arms 708 below carrier 601. The arms 708 transport the mask 301 and carrier 601 to the aligner 711. Actuator 706 places mask 301 and carrier 601 on aligner 711 and then actuator 706 retracts arms 708. Aligner 711 aligns mask 301 and carrier 601. Actuator 706 extends arms 708 under the now aligned mask 301 and carrier 601. Actuator arms 708 lift mask 301 and carrier 601 a distance 903 to vacuum chuck 710, as depicted in FIG. 9B. Distance 903 is a pre-calibrated distance. Vacuum chuck 710 engages the outer region 902 and chucks mask 301 to the vacuum chuck 710. With the mask 301 chucked to the vacuum chuck 710, actuator arms 708 lower the carrier 601, as depicted in FIG. 9C. Once lowered, actuator arms 708 retract with carrier 601.

Figure 9D:
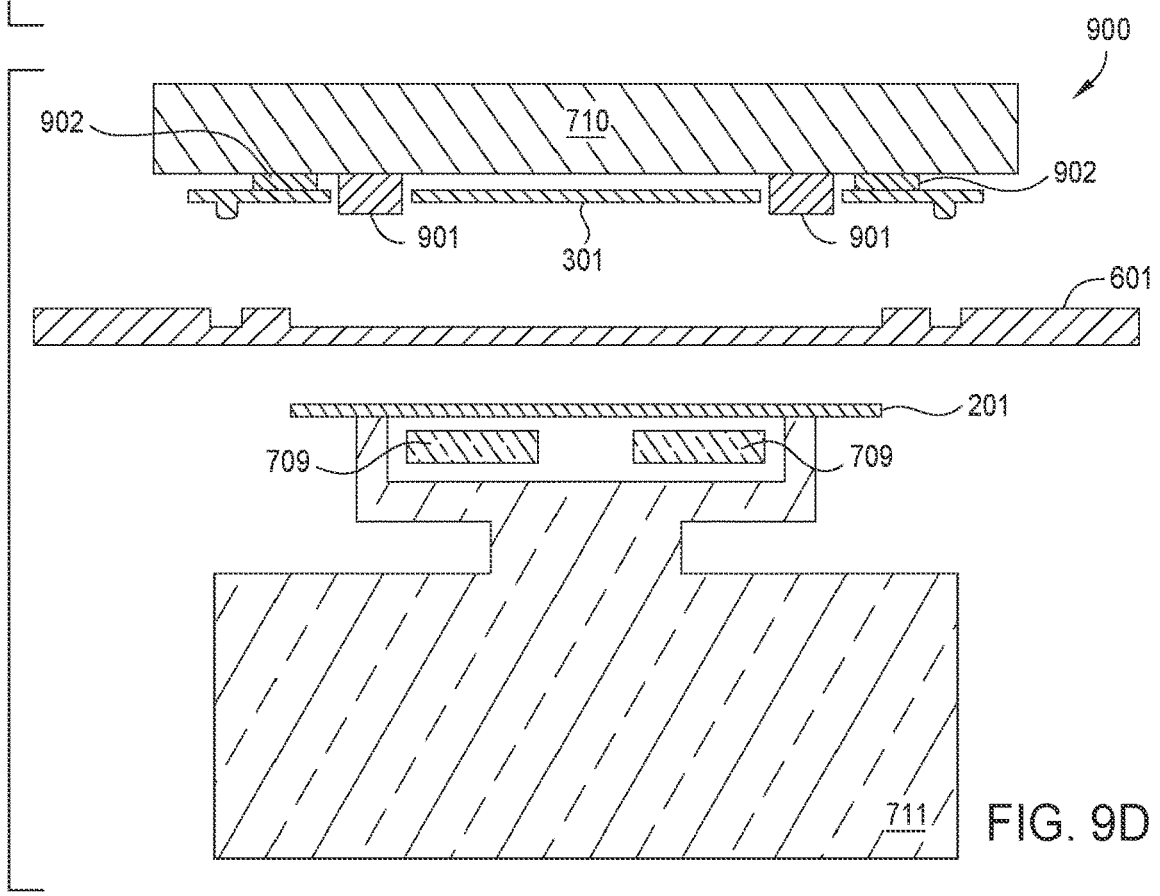
Figure 9E:
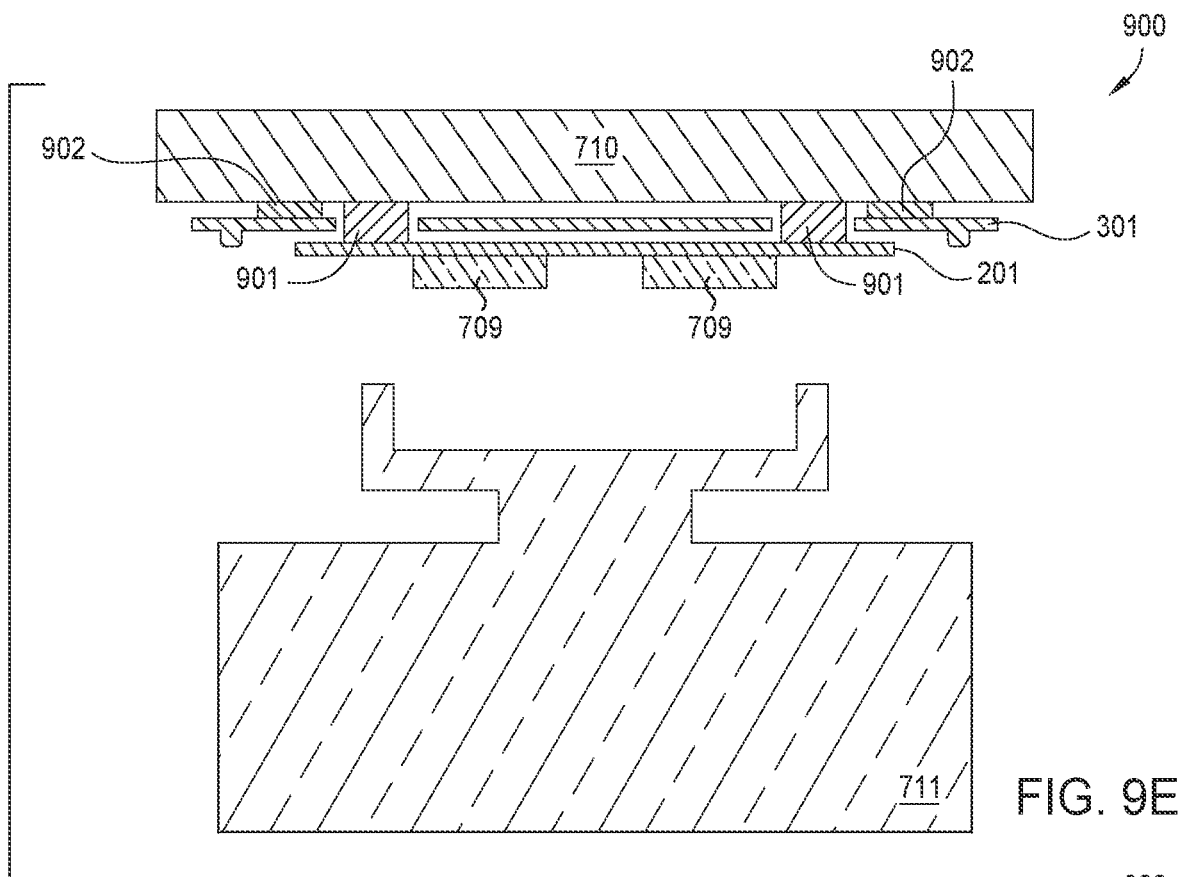
Figure 9F:
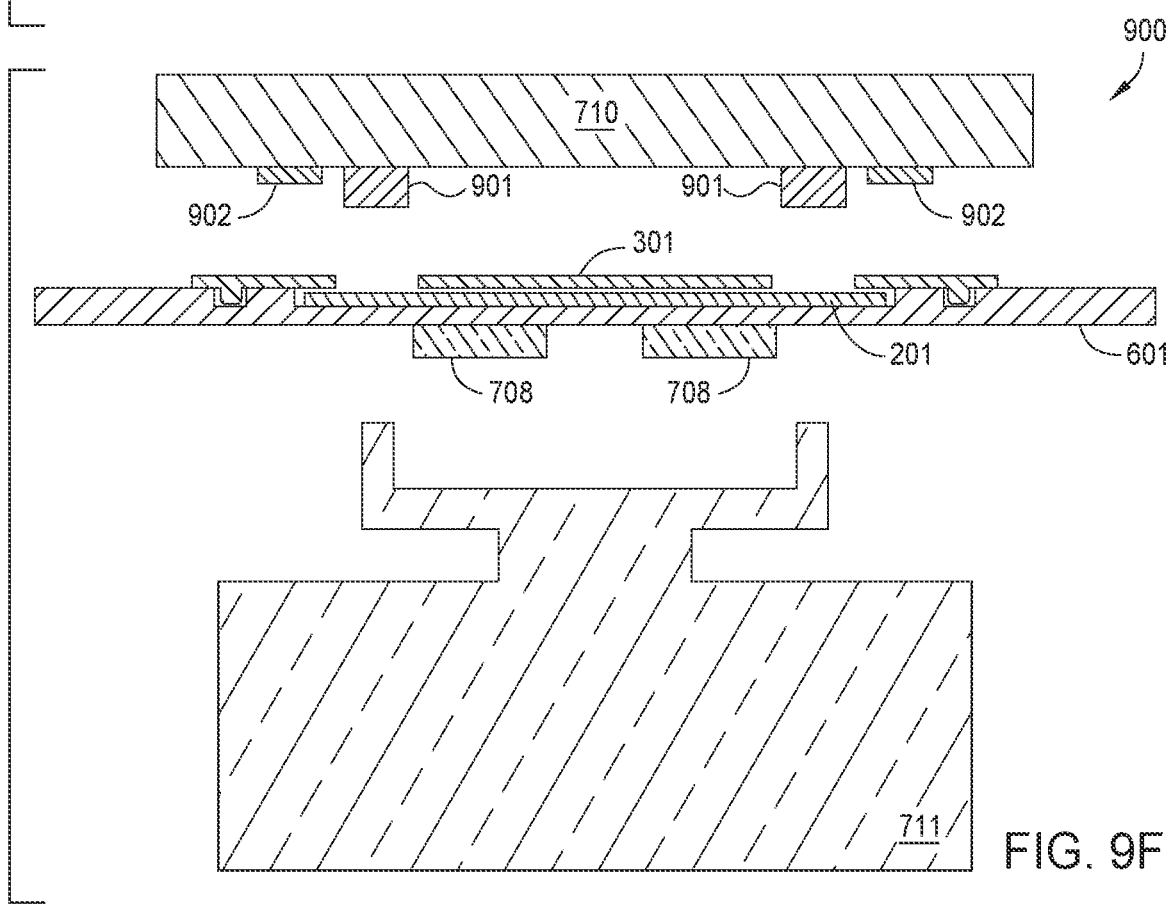

Actuator 707 extend actuator arms 709 into FOUP 802. Arms 709 receive substrate 201. Arms 709 transport the substrate 201 to the aligner 711. Actuator 707 retract arms 709 while aligner 711 aligns substrate 201. Arms 709 extend below the now aligned substrate 201, as depicted in FIG. 9D. As depicted in FIG. 9E, arms 709 lift substrate 201 the distance 903 to the vacuum chuck 710. Vacuum chuck 710 engages the inner region 901 and chucks the substrate 201 to the vacuum chuck 710. Actuator arms 709 now lower and retract. Actuator arms 708 now extend carrier 601. Arms 708 lift carrier 601 the distance 903 to vacuum chuck 710. The inner region 901 of vacuum chuck 710 release the substrate 201. The outer region 902 of vacuum chuck 710 release the mask 301. As depicted in FIG. 9F the now fully assembled carrier assembly 600 is lowered by arms 708. Actuator arms 708 retract carrier assembly 600 and return the full carrier assembly 600 to FOUP 801a. Actuator arms 708 are now able to retrieve another mask 301 and carrier 601 assembly from FOUP 801a. Moving in the downward direction 806, actuator arms retrieve the next mask 301 and carrier 601 are received from the next slot. The build process disclosed above is repeated until all assemblies of FOUP 801a are complete. Once all assemblies 600 of FOUP 801a are complete, the process is repeated for FOUP 801b. The process depicted in FIGS. 9A-9F results in fully assembled carrier assemblies 600 in FOUPs 801a and 801b.

The process disclosed above may also be completed without mask 301. The process begins by actuator 706 extending actuator arms 708 into FOUP 801a. It receives a carrier 601 by extending arms 708 below carrier 601. The arms 708 transport the carrier 601 to the aligner 711. Actuator 706 places carrier 601 on aligner 711 and then actuator 706 retracts arms 708. Aligner 711 aligns carrier 601. Once aligned, actuator arms 708 retract with carrier 601.

Actuator 707 extend actuator arms 709 into FOUP 802. Arms 709 receive substrate 201. Arms 709 transport the substrate 201 to the aligner 711. Actuator 707 retract arms 709 while aligner 711 aligns substrate 201. Arms 709 extend below the now aligned substrate 201. Arms 709 lift substrate 201 the distance 903 to the vacuum chuck 710. Vacuum chuck 710 engages the inner region 901 and chucks the substrate 201 to the vacuum chuck 710. Actuator arms 709 now lower and retract. Actuator arms 708 now extend carrier 601. Arms 708 lift carrier 601 the distance 903 to vacuum chuck 710. The inner region 901 of vacuum chuck 710 release the substrate 201. Substrate 201 and carrier 601 are lowered by arms 708. Actuator arms 708 retract substrate 201 and carrier 601 and return the substrate 201 and carrier 601 assembly to FOUP 801a. Actuator arms 708 are now able to retrieve another carrier 601 from FOUP 801a. Moving in the downward direction 806, actuator arms retrieve the next carrier 601 from the next slot. The build process disclosed above is repeated until all assemblies of FOUP 801a are complete. Once all assemblies of FOUP 801a are complete, the process is repeated for FOUP 801b. The process disclosed above results in fully assembled substrate 201 and carrier 601 assemblies in FOUPs 801a and 801b. It is to be understood that while the embodiment describes aligning the carrier 601, aligning the substrate 201, and then assembling the carrier 601 and substrate 201 as an assembly, aligning the substrate 201 may occur prior to aligning the carrier 601 such that the substrate 201 is coupled to the vacuum chuck 710 while the carrier 601 is aligned.

Often, a substrate 201 needs to be processed on the front side and the backside. Flipper device 803 allows a substrate 201 to be flipped automatically so that substrate 201 may be processed on the backside in subsequent processes. Actuator 706 extend arms 708 into FOUP 801a and receive a carrier assembly 600 from slot 804a. Actuator arms 708 place carrier assembly 600 on aligner 711. Actuator 706 retracts arms 708. Aligner 711 orients assembly 600. Arms 708 receive aligned assembly 600 and lift assembly 600 predetermined distance 903 towards vacuum chuck 710. Vacuum chuck 710 engages the inner region 901 to chuck substrate 201 and outer region 902 to chuck mask 301. Leaving substrate 201 and mask 301 behind, arms 708 lower carrier 601. Actuator 706 retracts arms 708 and carrier 601. Actuator 707 extends arms 709 below vacuum chuck 710. Arms 708 lift distance 903 to receive substrate 201 on vacuum chuck 710. Vacuum chuck 710 turns off the inner region 901, releasing substrate 201. Arms 709 lower substrate 201. Actuator 707 extend arms 709 to place substrate 201 into flipper device 803. Actuator 707 retracts arms 709. Flipper device 803 flips substrate 201 180 degrees to the backside of substrate 201. Arms 709 extend into flipper device 803 and receive substrate 201. Actuator arms 709 transport substrate 201 to aligner 711. Actuator 707 retracts arms 709 and aligner 711 aligns substrate 201. Arms 709 receive aligned substrate 201 and lift substrate 201 distance 903 to vacuum chuck 710. Vacuum chuck 710 engages inner region 901 to chuck substrate 201. Actuator 707 lowers and retracts arms 709. Actuator 706 extends arms 708 and carrier 601 below vacuum chuck 710. Arms 708 lift carrier 601 to vacuum chuck 710. Vacuum chuck 710 disengages inner region 901 and outer region 902 releasing substrate 201 and mask 301 onto carrier 601. Actuator arms 708 lower the full carrier assembly 600. Actuator arms 708 extend into FOUP 801a and place the full carrier assembly 600 back into slot 804a. The build process disclosed above is repeated until all assemblies of FOUP 801a are complete. Once all assemblies 600 of FOUP 801a are complete with flipped substrates 201, the process is repeated for FOUP 801b. The process disclosed above results in fully assembled carrier assemblies 600 with flipped substrates 201 in FOUPs 801a and 801b. The carrier assemblies 600 are then ready to process substrates 201 on the backside. The process disclosed above may also be completed without mask 301, resulting in assemblies with carrier 601 and flipped substrate 201.

In another embodiment, the build station 703 is utilized to unbuild carrier assemblies 600. The mask 301 and carrier 601 are able to be reused for multiple processing sequences. The unbuild process begins with FOUPs 801a and 801b loaded with complete carrier assemblies 600. In one embodiment, the substrate 201 has the front side processed. In another embodiment, the substrate 201 has the front side and back side processed. The actuator arms 708 extend into FOUP 801a and receive the carrier assembly 600 from slot 808. Actuator arms 708 place carrier assembly 600 onto aligner 711. Actuator 706 retracts arms 708 and aligner 711 aligns assembly 600. Arms 708 extend to receive assembly 600. Arms 708 raise assembly 600 distance 903 to vacuum chuck 710. Vacuum chuck 710 engages the inner region 901 to chuck the substrate 201 and the outer region 902 to chuck the substrate 201. Actuator 706 then lowers and retracts arms 708 with carrier 601. Actuator 707 extends arms 709 below vacuum chuck 710. Arms 709 are lifted distance 903 to substrate 201 on vacuum chuck 710. Vacuum chuck 710 disengages the inner region 901 releasing substrate 201 onto actuator arms 709. Actuator arms 709 lower substrate 201 and extend into FOUP 802. The substrate 201 is placed into the lowest slot 808x of FOUP 802. Arms 708 then extend carrier 601 below vacuum chuck 710. Arms 708 lift carrier 601 distance 903 to vacuum chuck 710 to receive mask 301. Vacuum chuck 710 disengages outer region 902 releasing mask 301 onto carrier 601. Actuator arms 708 lower mask 301 and carrier 601 assembly and place mask 301 and carrier 601 into slot 804L.

Once assemblies 600 of FOUP 801a are fully unbuilt, the process is repeated for FOUP 801b. The process is repeated until all carrier assemblies 600 of FOUPs 801a and 801b have been unbuilt. The result of the unbuild process described above is FOUPs 801a and 801b loaded with mask 301 and carrier 601 and FOUP 802 loaded with processed substrates 201. During the unbuild process, carrier assemblies 600 are unloaded from FOUPs 801a and 801b in direction 807 and substrates 201 are loaded into FOUP 802 in direction 807. The process disclosed above may also be completed without mask 301, resulting in carrier FOUPS 801a and 801b loaded with carrier 601 and FOUP 802 loaded with processed substrates 201.

In one embodiment, a method comprises: disposing a base layer of a device material on a surface of a substrate, the base layer having a base layer depth; and disposing one or more mandrels of the device material on the base layer, wherein the disposing the one or more mandrels comprises: positioning a mask over of the base layer, the mask having: a first portion of a pattern of slots having a first masked depth, the first masked depth corresponding to mandrels having a first mandrel depth; and a second portion of the pattern of slots having a second masked depth, the second masked depth corresponding to mandrels having a second mandrel depth; and depositing the device material with the mask positioned over the base layer to form an optical device having the base layer with the base layer depth and the one or more mandrels having the first mandrel depth and the second mandrel depth. The device material is deposited by PVD. The device material is deposited by CVD. The device material is deposited by ALD. The mandrels comprise titanium dioxide ($TiO_2$), zinc oxide (ZnO), tin dioxide ($SnO_2$), aluminum-doped zinc oxide (AZO), fluorine-doped tin oxide (FTO), cadmium stannate (tin oxide) (CTO), and zinc stannate (tin oxide) ($SnZnO_3$), silicon nitride ($Si_3N_4$), and amorphous silicon (a-Si) containing materials. The first mandrel depth is greater than the second mandrel depth. The first masked depth is greater than the second masked depth.

In another embodiment, a processing system comprises: a factory interface; a first actuator disposed within the factory interface; a second actuator disposed within the factory interface; an aligner station disposed within the factory interface; and a flipper device coupled to the factory interface. The factory interface comprises four load port stations. The flipper device is coupled to the factory interface at a first load port station of the four load port stations. The aligner is disposed between the first actuator and the second actuator. The aligner station comprises a vacuum chuck. The vacuum chuck comprises an inner region for chucking substrates and an outer region for separately chucking masks. The aligner station comprises an aligner.

In another embodiment, a method of assembling a carrier assembly comprises: inserting a carrier having a mask thereon into an alignment station; aligning the carrier and mask; separating the mask from the carrier; removing the carrier from the alignment station; inserting a substrate into the alignment station; contacting the substrate to the mask; and contacting the carrier to the substrate and mask to create a carrier assembly. Separating the mask from the carrier comprises moving the mask to a vacuum chuck and chucking the mask to the vacuum chuck. Contacting the substrate to the mask comprises moving the substrate to a vacuum chuck and chucking the substrate to the vacuum chuck. Contacting the carrier to the substrate and the mask comprises unchucking the substrate and the mask from a vacuum chuck. The method further comprises inserting the carrier into the alignment station after contacting the substrate to the mask. At least a portion of the mask and the substrate rest within the carrier.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
    inserting a carrier having a mask thereon into an alignment station;
    aligning the carrier and the mask;
    separating the mask from the carrier;
    removing the carrier from the alignment station;
    inserting a substrate into the alignment station;
    contacting the substrate to the mask; and
    contacting the carrier to the substrate and mask to create a carrier assembly.

2. The method of claim 1, wherein separating the mask from the carrier comprises moving the mask to a vacuum chuck and chucking the mask to the vacuum chuck.

3. The method of claim 1, wherein contacting the substrate to the mask comprises moving the substrate to a vacuum chuck and chucking the substrate to the vacuum chuck.

4. The method of claim 1, wherein contacting the carrier to the substrate and the mask comprises unchucking the substrate and the mask from a vacuum chuck.

5. The method of claim 1, further comprising inserting the carrier into the alignment station after contacting the substrate to the mask.

6. The method of claim 1, wherein at least a portion of the mask and the substrate rest within the carrier.

7. The method of claim 1, wherein the mask has:
    a first portion of a pattern of slots having a first masked depth, the first masked depth corresponding to one or more mandrels having a first mandrel depth; and
    a second portion of the pattern of slots having a second masked depth, the second masked depth corresponding to one or more mandrels having a second mandrel depth, wherein the first masked depth is greater than the second masked depth such that the first mandrel depth is greater than the second mandrel depth.

* * * * *